(12) United States Patent
Ki et al.

(10) Patent No.: US 12,394,767 B2
(45) Date of Patent: Aug. 19, 2025

(54) ELECTRONIC DEVICES AND METHODS OF MANUFACTURING ELECTRONIC DEVICES

(71) Applicant: Amkor Technology Singapore Holding Pte. Ltd., Valley Point (SG)

(72) Inventors: Won Myoung Ki, Incheon (KR); In Su Mok, Incheon (KR); Soo Hyun Kim, Incheon (KR); Tae Kyeong Hwang, Seoul (KR); Shaun Bowers, Gilbert, AZ (US); George Scott, Chandler, AZ (US)

(73) Assignee: Amkor Technology Singapore Holding Pte. Ltd., Singapore (SG)

( * ) Notice: Subject to any disclaimer, the term of this patent is extended or adjusted under 35 U.S.C. 154(b) by 358 days.

(21) Appl. No.: 17/958,007

(22) Filed: Sep. 30, 2022

(65) Prior Publication Data

US 2024/0113090 A1   Apr. 4, 2024

(51) Int. Cl.
*H01L 25/16*  (2023.01)
*H01L 21/56*  (2006.01)
(Continued)

(52) U.S. Cl.
CPC ............ *H01L 25/16* (2013.01); *H01L 21/563* (2013.01); *H01L 21/568* (2013.01); *H01L 23/3185* (2013.01); *H01L 24/13* (2013.01); *H01L 24/16* (2013.01); *H01L 24/32* (2013.01); *H01L 24/73* (2013.01); *H01L 24/92* (2013.01); *H01L 2224/05073* (2013.01); *H01L 2224/05124* (2013.01); *H01L 2224/05147* (2013.01);
(Continued)

(58) Field of Classification Search
CPC ..... H01L 25/16; H01L 21/563; H01L 21/568; H01L 23/3185; H01L 24/13; H01L 24/16; H01L 24/32; H01L 24/73; H01L 24/92; H01L 2224/05073; H01L 2224/13082; H01L 2224/13083; H01L 2224/16227; H01L 2224/16265; H01L 2224/32225; H01L 2224/73204; H01L 2224/92125; H01L 2924/18161; H01L 2924/19103; H01L 23/3128; H01L 2221/68345; H01L 24/96; H01L 24/19; H01L 24/20; H01L 23/3107; H01L 21/50; H01L 21/56

See application file for complete search history.

(56) References Cited

U.S. PATENT DOCUMENTS 11,569,176 B2 * 1/2023 Han ................. H01L 23/5386
12,033,910 B2 * 7/2024 Ko ......................... H01L 24/20
(Continued)

*Primary Examiner* — Douglas W Owens
(74) *Attorney, Agent, or Firm* — Kevin B. Jackson

(57) ABSTRACT

In one example, an electronic device includes an electronic component including a component first side, a component second side opposite to the component first side, and a component lateral side connecting the component first side to the component second side, wherein the component lateral side defines a perimeter of the electronic component. A first intermediate terminal is coupled to the electronic component within the perimeter. An intermediate component is coupled to the first intermediate terminal within the perimeter. An encapsulant structure is over the intermediate component, at least a portion of the first intermediate terminal, and at least a portion of the electronic component. Other examples and related methods are also disclosed herein.

20 Claims, 14 Drawing Sheets

(51) Int. Cl.
  *H01L 23/00* (2006.01)
  *H01L 23/31* (2006.01)
(52) U.S. Cl.
  CPC ............ *H01L 2224/05573* (2013.01); *H01L 2224/05611* (2013.01); *H01L 2224/05613* (2013.01); *H01L 2224/05616* (2013.01); *H01L 2224/05624* (2013.01); *H01L 2224/05639* (2013.01); *H01L 2224/05644* (2013.01); *H01L 2224/05647* (2013.01); *H01L 2224/13082* (2013.01); *H01L 2224/13083* (2013.01); *H01L 2224/13111* (2013.01); *H01L 2224/13113* (2013.01); *H01L 2224/13116* (2013.01); *H01L 2224/13139* (2013.01); *H01L 2224/13144* (2013.01); *H01L 2224/13147* (2013.01); *H01L 2224/13155* (2013.01); *H01L 2224/13164* (2013.01); *H01L 2224/16227* (2013.01); *H01L 2224/16265* (2013.01); *H01L 2224/32225* (2013.01); *H01L 2224/73204* (2013.01); *H01L 2224/92125* (2013.01); *H01L 2924/0132* (2013.01); *H01L 2924/0133* (2013.01); *H01L 2924/18161* (2013.01); *H01L 2924/19103* (2013.01)

(56) References Cited

U.S. PATENT DOCUMENTS

| | | | |
|---|---|---|---|
| 2014/0217604 A1* | 8/2014 | Chou | H01L 25/50 257/774 |
| 2016/0133601 A1* | 5/2016 | Ko | H01L 23/49827 257/738 |
| 2017/0110394 A1* | 4/2017 | Denda | H01L 24/16 |
| 2020/0105689 A1* | 4/2020 | Hwang | H01L 23/49534 |
| 2020/0185330 A1* | 6/2020 | Yu | H01L 24/24 |
| 2020/0395272 A1* | 12/2020 | Bang | H01L 23/49548 |
| 2021/0257332 A1* | 8/2021 | Homma | H01L 25/18 |
| 2023/0054960 A1* | 2/2023 | Fukamoto | C08G 59/40 |
| 2023/0121621 A1* | 4/2023 | Jin | H01L 21/4857 257/668 |
| 2023/0137998 A1* | 5/2023 | Scott | H01L 21/568 257/668 |

* cited by examiner

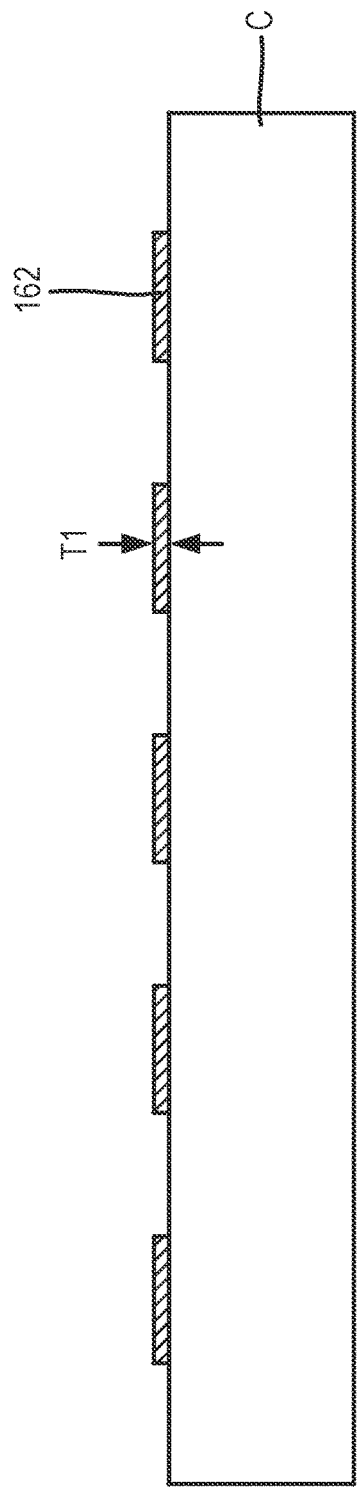
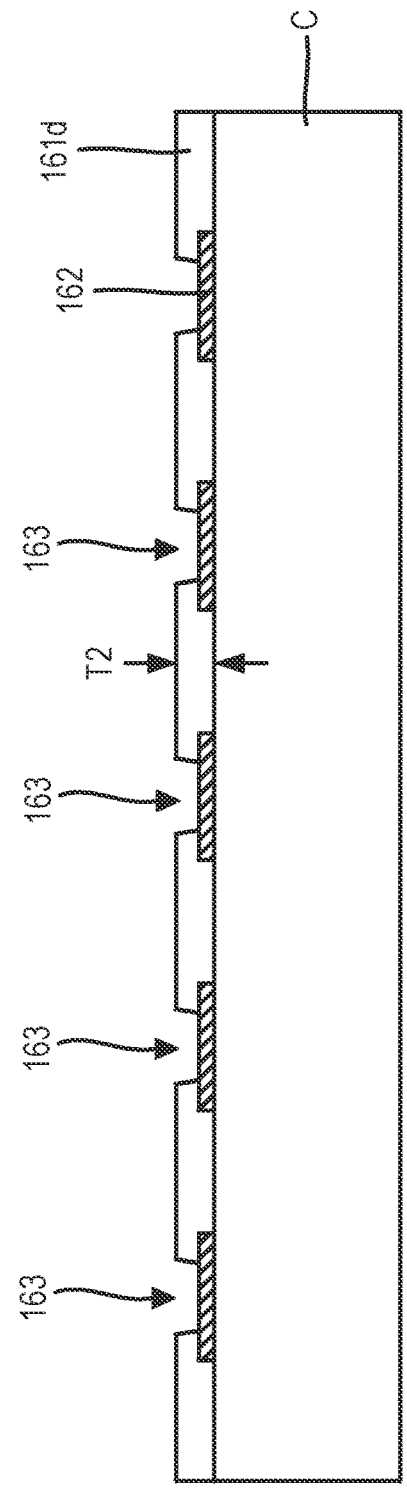

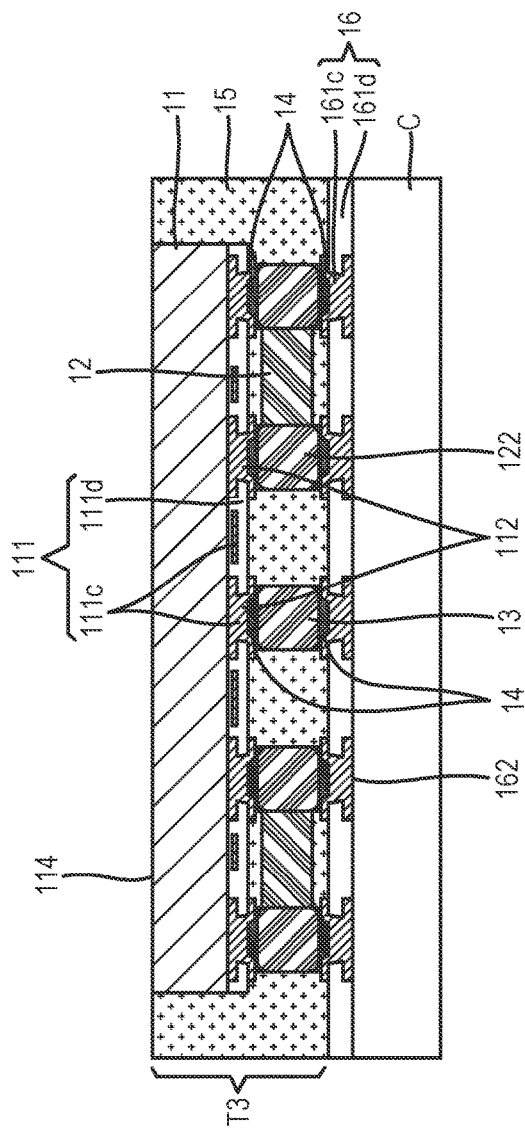
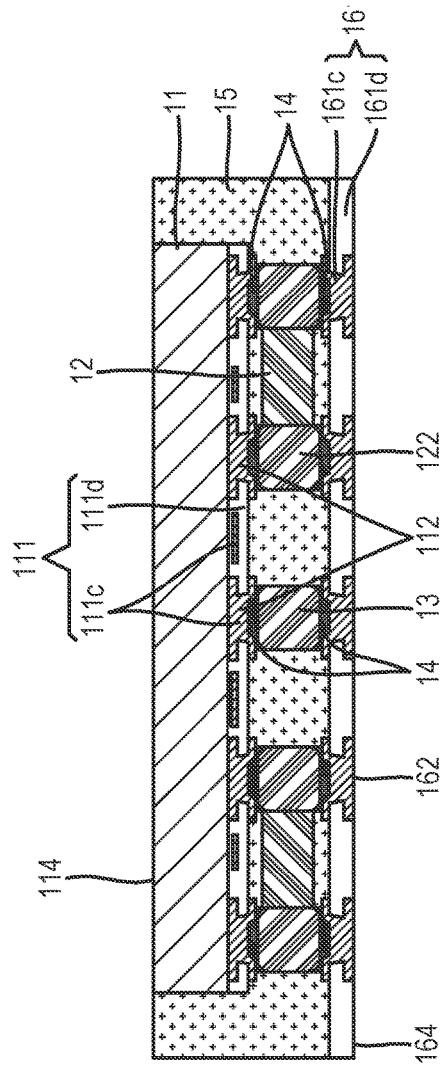

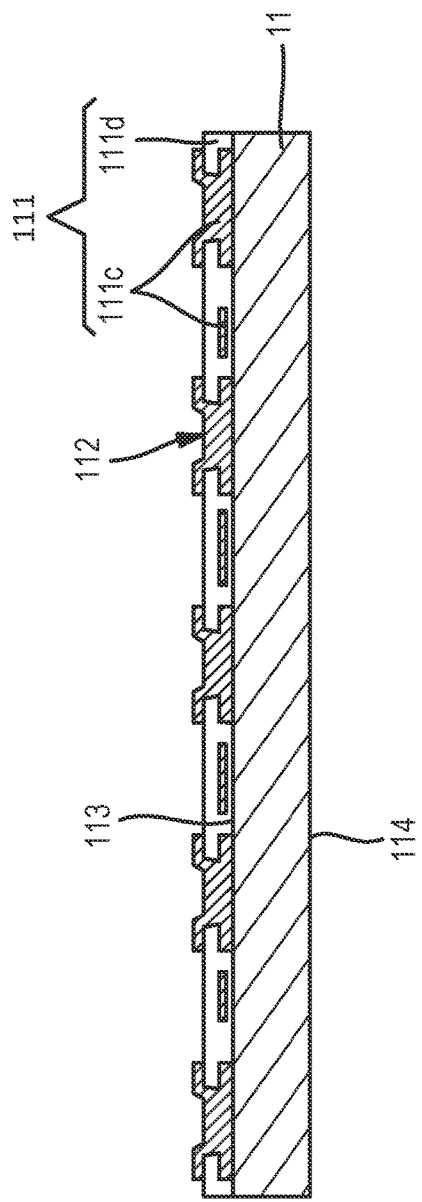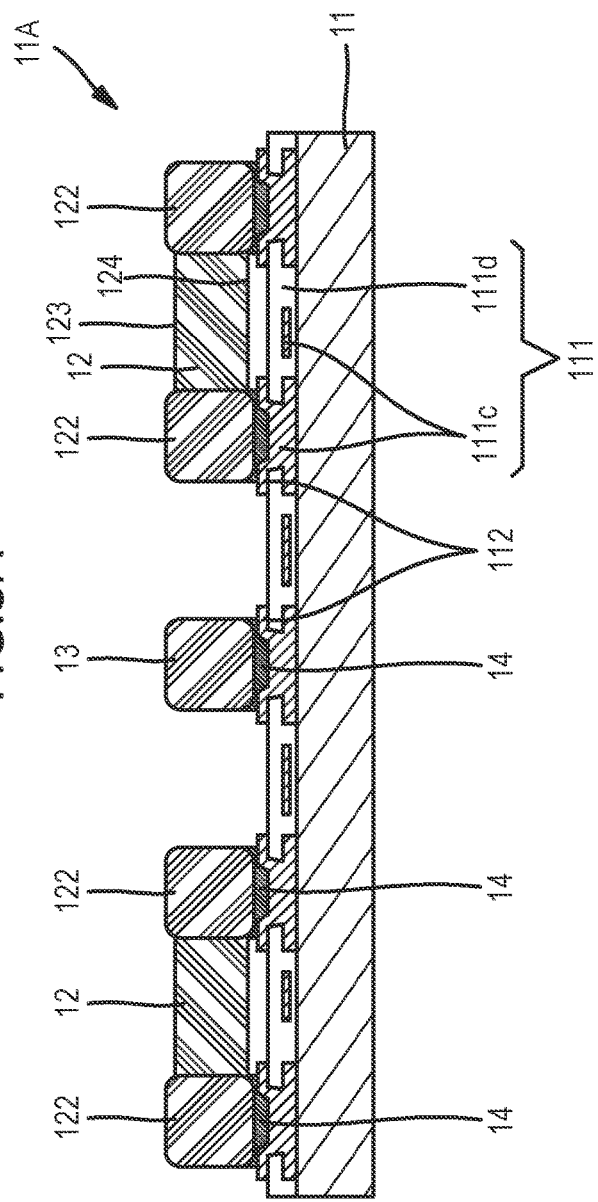
FIG.3A
FIG.3B

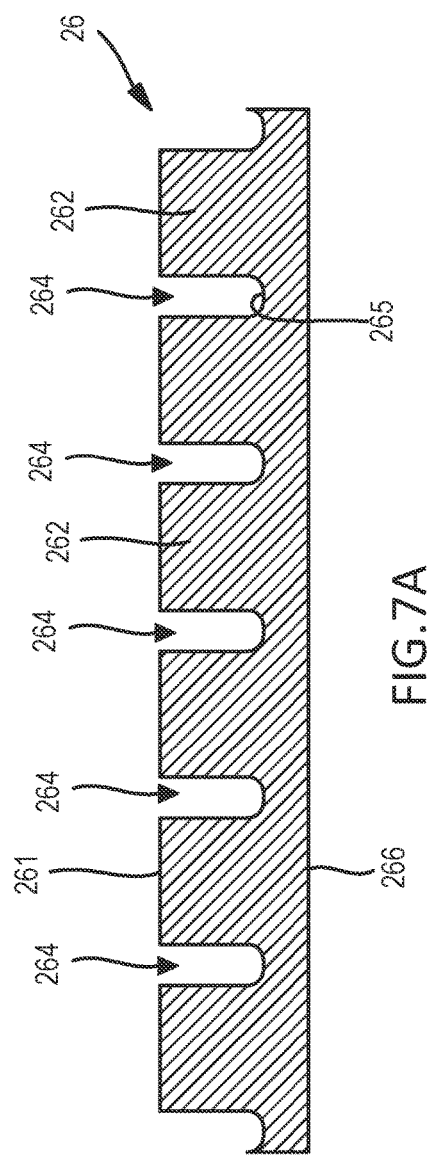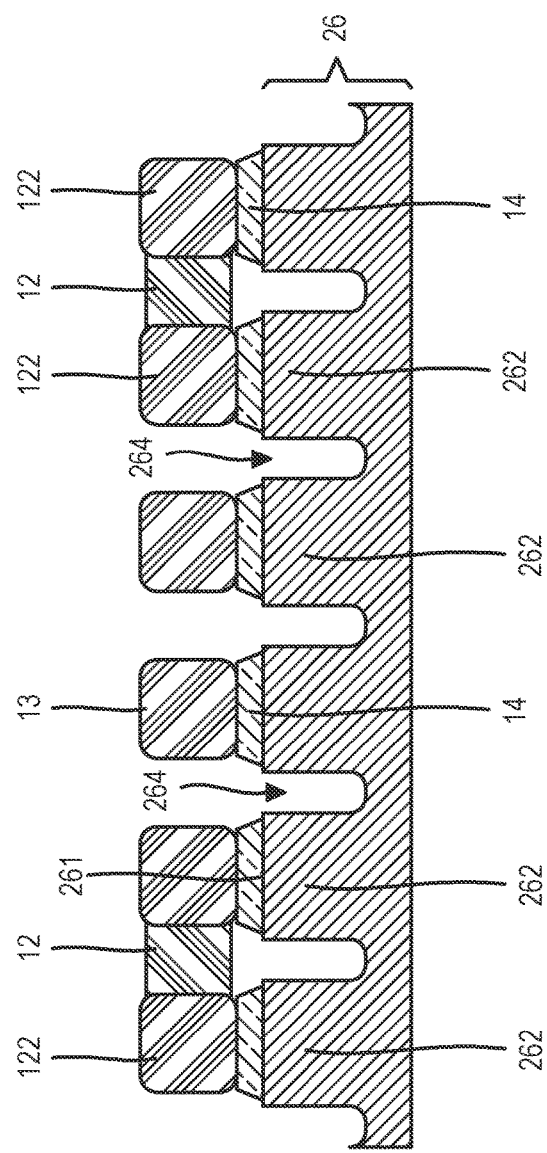
FIG.7A
FIG.7B

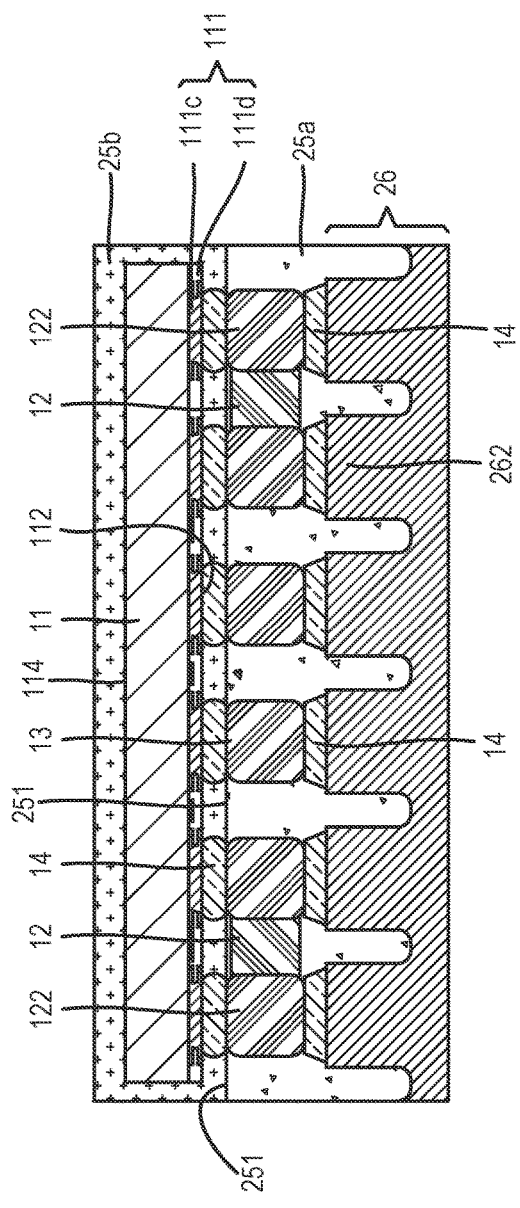
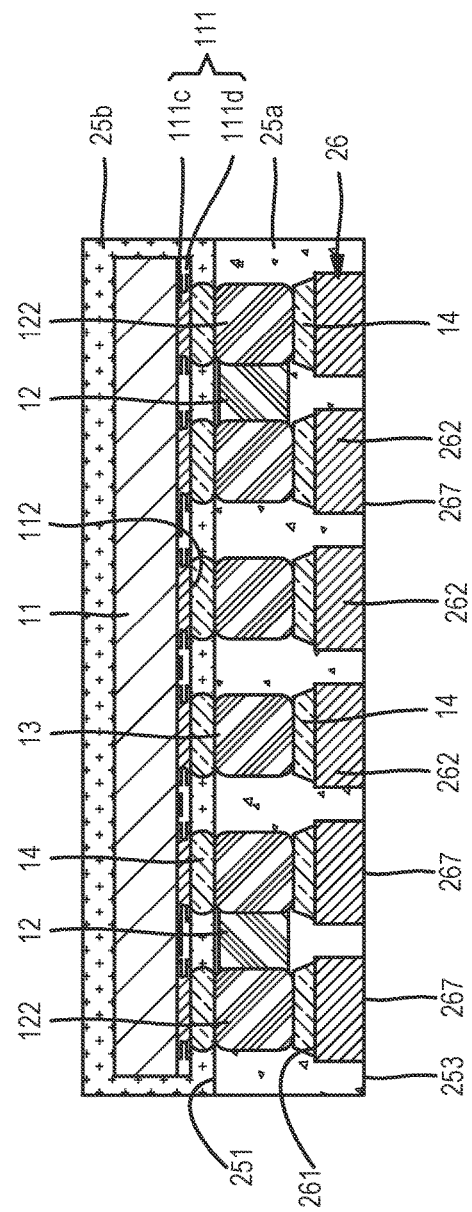
FIG.7E
FIG.7F

ELECTRONIC DEVICES AND METHODS OF MANUFACTURING ELECTRONIC DEVICES

TECHNICAL FIELD

The present disclosure relates, in general, to electronic devices, and more particularly, to electronic devices and methods for manufacturing electronic devices.

BACKGROUND

Prior electronic packages and methods for forming electronic packages are inadequate, resulting in, for example, excess cost, decreased reliability, relatively low performance, or package sizes that are too large. Further limitations and disadvantages of conventional and traditional approaches will become apparent to one of skill in the art, through comparison of such approaches with the present disclosure and reference to the drawings.

BRIEF DESCRIPTION OF THE DRAWINGS

FIGS. 2A, 2B, 2C, 2D, 2E, 2F, and 2G show cross-sectional views of an example method for manufacturing an example electronic device.

FIGS. 3A and 3B show cross-sectional views of an example method for manufacturing an example component device of the electronic device shown in FIG. 2D.

FIGS. 7A, 7B, 7C, 7D, 7E, 7F, and 7G show cross-sectional views of an example method for manufacturing an example electronic device.

Figure 1:
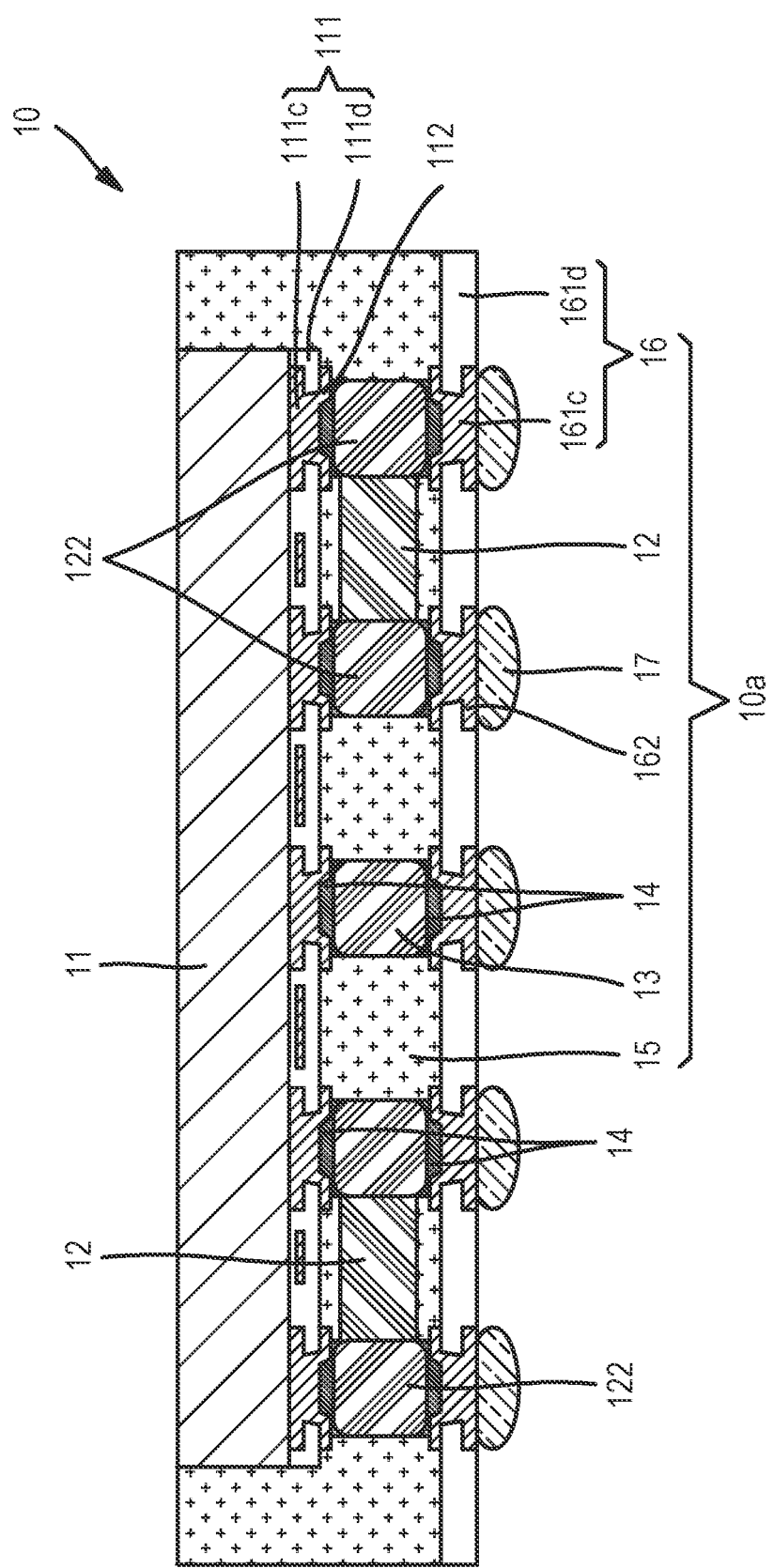
FIG. 1 shows a cross-sectional view of an example electronic device.

The following discussion provides various examples of electronic devices and methods of manufacturing electronic devices. Such examples are non-limiting, and the scope of the appended claims should not be limited to the particular examples disclosed. In the following discussion, the terms "example" and "e.g." are non-limiting.

The figures illustrate the general manner of construction, and descriptions and details of well-known features and techniques may be omitted to avoid unnecessarily obscuring the present disclosure. In addition, elements in the drawing figures are not necessarily drawn to scale. For example, the dimensions of some of the elements in the figures may be exaggerated relative to other elements to help improve understanding of the examples discussed in the present disclosure. Crosshatching lines may be used throughout the figures to denote different parts but not necessarily to denote the same or different materials. Throughout the present disclosure, like reference numbers denote like elements. Accordingly, elements with like element numbering may be shown in the figures but may not be necessarily repeated herein for the sake of clarity.

The term "or" means any one or more of the items in the list joined by "or". As an example, "x or y" means any element of the three-element set {(x), (y), (x, y)}. As another example, "x, y, or z" means any element of the seven-element set {(x), (y), (z), (x, y), (x, z), (y, z), (x, y, z)}.

The terms "comprises," "comprising," "includes," and/or "including," are "open ended" terms and specify the presence of stated features, but do not preclude the presence or addition of one or more other features.

The terms "first," "second," etc. may be used herein to describe various elements, and these elements should not be limited by these terms. These terms are only used to distinguish one element from another. Thus, for example, a first element discussed in this disclosure could be termed a second element without departing from the teachings of the present disclosure.

Unless specified otherwise, the term "coupled" may be used to describe two elements directly contacting each other or to describe two elements indirectly coupled by one or more other elements. For example, if element A is coupled to element B, then element A can be directly coupled element B or indirectly connected to element B by an intervening element C. As used herein, the term coupled can refer to an electrical coupling or a mechanical coupling. Similarly, the terms "over" or "on" may be used to describe two elements directly contacting each other or to describe two elements indirectly coupled by one or more other elements.

DESCRIPTION

In an example, an electronic device comprises an electronic component including a component first side, a component second side opposite to the component first side, and a component lateral side connecting the component first side to the component second side, wherein the component lateral side defines a perimeter of the electronic component. A first intermediate terminal is coupled to the electronic component within the perimeter. An intermediate component is coupled to the first intermediate terminal within the perimeter. An encapsulant structure is over the intermediate component, at least a portion of the first intermediate terminal, and at least a portion of the electronic component.

In an example, an electronic device includes an electronic component. A component redistribution structure is coupled to the electronic component and includes a redistribution conductive structure and a redistribution dielectric structure. A first intermediate terminal is coupled to the redistribution conductive structure. An intermediate component is coupled to the first intermediate terminal. An encapsulant structure is located over the component redistribution structure, the intermediate component, at least a portion of the first intermediate terminal, and at least a portion of the electronic component.

In an example, a method of manufacturing an electronic device includes providing an electronic component including a component redistribution structure coupled to the electronic component, the component redistribution structure comprising a redistribution conductive structure and a redistribution dielectric structure. The method includes providing an intermediate component comprising a first intermediate terminal. The method includes coupling the first intermediate terminal to the redistribution conductive structure. The method includes providing an encapsulant structure over the component redistribution structure, the intermediate component, at least a portion of the first intermediate terminal, and at least a portion of the electronic component.

Other examples are included in the present disclosure. Such examples may be found in the figures, in the claims, and/or in the description of the present disclosure.

FIG. 1 shows a cross-sectional view of an example electronic device 10. In the example shown in FIG. 1, electronic device 10 can comprise electronic component 11, intermediate components 12, conductive interface 14, encapsulant 15, device interface structure 16, and external terminals 17. In some examples, electronic device 10 can comprise vertical interconnect 13.

In some examples, electronic component 11 can comprise component redistribution structure 111. Component redistribution structure 111 can comprise conductive structure 111c and dielectric structure 111d. Conductive structure 111c can comprise component terminals 112. Intermediate components 12 can comprise intermediate terminals 122. Device interface structure 16 can comprise conductive structure 161c and dielectric structure 161d. Conductive structure 161c can comprise device terminals 162.

Conductive interface 14, encapsulant 15, device interface structure 16, and external terminals 17 can comprise or be referred to as electronic package 10a or package 10a. Electronic package 10a can protect electronic component 11 and intermediate components 12 from exposure to external elements and/or environments. Electronic package 10a can provide electrical coupling between an external component and electronic component 11 and intermediate components 12 or between other electronic packages and electronic component 11 and intermediate components 12.

Figure 2C:
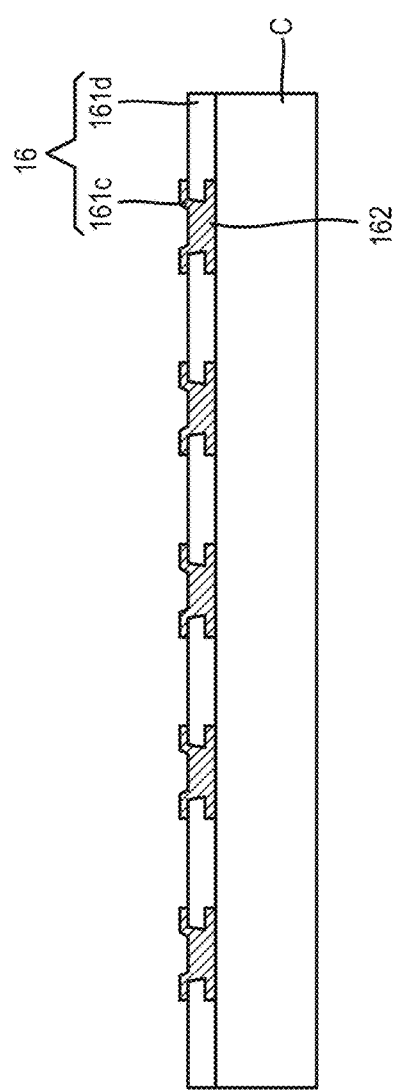

FIGS. 2A to 2G show cross-sectional views of an example method for manufacturing an example electronic device 10. FIG. 2A shows a cross-sectional view of electronic device 10 at an early stage of manufacture. In the example shown in FIG. 2A, device terminals 162 can be provided on the upper side of a carrier C. Device terminals 162 can be provided to have a plurality of patterns on the upper side of carrier C. In some examples, device terminals 162 can have a constant thickness T1. Device terminals 162 can each comprise or be referred to as a conductor, a conductive material, a pad, a pillar, or an under-bump-metallurgy (UBM). In some examples, device terminals 162 can comprise copper, gold, silver, or nickel. In some examples, device terminals 162 can be provided by electrolytic plating. For example, device terminals 162 can be provided by covering the upper side of carrier C with a metal seed layer, covering portions of the metal seed layer with a patterned mask layer (e.g., a photoresist), and plating the uncovered portions of the metal seed layer. After plating, the patterned mask layer is removed, leaving device terminals 162 formed in the desired pattern/locations. The seed layer can be included in device terminals 162. In some examples, the thickness T1 of device terminal 162 can be in the range of approximately 3 micrometers (μm) to approximately 15 μm.

Carrier C can be a substantially planar plate. In some examples, carrier C can comprise or be referred to as a plate, a board, a wafer, a panel, or a strip. For example, carrier C can be made of steel, stainless steel, aluminum, copper, ceramic, or glass. In some examples, the thickness of carrier C can be in the range of approximately 0.3 millimeters (mm) to approximately 2 mm, and the width of carrier C can be in the range of approximately 100 mm to approximately 450 mm. In some examples, carrier C can comprise a panel, such as a square pane with dimensions up to approximately 600 mm by 600 mm. Carrier C can serve to simultaneously support a plurality of components, such as a plurality of electronic components 11, intermediate components 12, conductive interfaces 14, encapsulants 15, and device interface structures 16; thus, allowing multiple electronic devices 10 to be formed concurrently on carrier C.

In some examples, a temporary adhesive layer can be provided on the surface of carrier C, and device terminals 162 may be formed over the temporary adhesive layer. The temporary adhesive layer can be formed on the surface of carrier C by: a coating method, such as spin coating, doctor blade, casting, painting, spray coating, slot die coating, curtain coating, slide coating, or knife over edge coating; a printing method, such as screen printing, pad printing, gravure printing, flexographic printing, offset printing, or inkjet printing; or by attachment of an adhesive film or an adhesive tape. In some examples, the temporary adhesive layer can comprise or be referred to as a temporary adhesive film, a temporary adhesive tape, or a temporary adhesive coating. For example, the temporary adhesive layer can be a heat release tape (or film) or a light release tape (or film), where the adhesive strength is weakened or removed by heat or light, respectively. In some examples, the adhesive strength of the temporary adhesive layer can be weakened or removed by physical force and/or by chemical reaction. The temporary adhesive layer can allow for separation of carrier C after deposition of encapsulant 15, as described in further detail below.

FIG. 2B shows a cross-sectional view of electronic device 10 at a later stage of manufacture. In the example shown in FIG. 2B, dielectric structure 161d can be provided to over carrier C and device terminals 162. Dielectric structure 161d can be provided to have a uniform thickness and can include apertures 163 exposing, at least, a portion of the upper side of device terminals 162. For example, apertures 163 can be formed by removing portions of dielectric structure 161d (e.g., by etching) or through patterned deposition of dielectric structure 161d. In some examples, the apertures 163 can be referred to as openings or orifices. In some examples, dielectric structure 161d can comprise or be referred to as a dielectric layer, a coreless layer, or a filler-free layer. For example, dielectric structure 161d can comprise an electrically insulating material, such as polymer, polyimide (PI), benzocyclobutene (BCB), polybenzoxazole (PBO), bismaleimide triazine (BT), a molding material, a phenolic resin, an epoxy, silicone, or an acrylate polymer. In some examples, dielectric structure 161d can be provided by spin coating, spray coating, dip coating, or rod coating. In some examples, the thickness T2 of dielectric structure 161d can be in the range of approximately 10 μm to approximately 50 μm.

FIG. 2C shows a cross-sectional view of electronic device 10 at a later stage of manufacture. In the example shown in FIG. 2C, conductive structure 161c can be formed over the upper side of dielectric structure 161d and within apertures 163 (FIG. 2B) of dielectric structure 161d. Conductive structure 161c can be formed on the upper side of device terminals 162. Conductive structure 161c can be provided to have a plurality of patterns (e.g., distinct traces) coupled to device terminals 162. In some examples, conductive structure 161c can comprise or be referred to as a conductive layer, a trace, a pad, a conductive via, a redistribution layer (RDL), a wiring pattern, or a circuit pattern. In some examples, conductive structure 161c can comprise copper, gold, silver, or nickel. In some examples, conductive structure 161c can comprise similar elements, features, materials, or manufacturing methods to those of device terminals 162, described above with reference to FIG. 2A. In some examples, the thickness of conductive structure 161c can be in the range of approximately 10 μm to approximately 50 μm. The thickness of conductive structure 161c can refer to an individual layer of conductive structure 161c.

Completed device interface structure 16 can comprise dielectric structure 161d and conductive structure 161c. Conductive structure 161c can comprise device terminals 162. Although dielectric structure 161d and conductive structure 161c are described as including one dielectric layer and two conductive layers (i.e., terminals 162 and structure 161c), respectively, it is contemplated and understood that dielectric structure 161d and conductive structure 161c can include any number of dielectric and conductive layers. In some examples, device interface structure 16 can comprise or be referred to as a device RDL, a device substrate, or a device interposer. Conductive structure 161c and terminals 162 can also be referred to as an interface conductive structure and dielectric structure 161d can be referred to as an interface dielectric structure.

In some examples, device interface structure 16 can be a pre-formed substrate. The pre-formed substrate can be manufactured prior to attachment to an electronic device and can comprise dielectric layers between respective conductive layers. The conductive layers can comprise copper and can be formed using an electroplating process. The dielectric layers can be non-photo-definable layers that can be attached as a pre-formed film rather than as a liquid and can include a resin with fillers such as strands, weaves, and/or other inorganic particles for rigidity and/or structural support. Since the dielectric layers are non-photo-definable, features such as vias or openings can be formed using a drill or laser. In some examples, the dielectric layers can comprise a prepreg material or Ajinomoto Buildup Film (ABF). The pre-formed substrate can include a permanent core structure or carrier such as, for example, a dielectric material comprising bismaleimide triazine (BT) or FR4, and dielectric and conductive layers can be formed on the permanent core structure. In other examples, the pre-formed substrate can be a coreless substrate omitting the permanent core structure, and the dielectric and conductive layers can be formed on a sacrificial carrier that is removed after formation of the dielectric and conductive layers and before attachment to the electronic device. The pre-formed substrate can be referred to as a printed circuit board (PCB) or a laminate substrate. Such pre-formed substrate can be formed through a semi-additive or modified-semi-additive process. Substrates in this disclosure can comprise pre-formed substrates.

In some examples, device interface structure 16 can be a RDL substrate. RDL substrates can comprise one or more conductive redistribution layers and one or more dielectric layers and (a) can be formed layer by layer over an electronic device to which the RDL substrate is to be coupled, or (b) can be formed layer by layer over a carrier and then entirely removed or at least partially removed after the electronic device and the RDL substrate are coupled together. RDL substrates can be manufactured layer by layer as a wafer-level substrate on a round wafer in a wafer-level process, and/or as a panel-level substrate on a rectangular or square panel carrier in a panel-level process. RDL substrates can be formed in an additive buildup process and can include one or more dielectric layers alternatingly stacked with one or more conductive layers and define respective conductive redistribution patterns or traces configured to collectively (a) fan-out electrical traces outside the footprint of the electronic device, and/or (b) fan-in electrical traces within the footprint of the electronic device.

The conductive patterns can be formed using a plating process such as, for example, an electroplating process or an electroless plating process. The conductive patterns can comprise a conductive material such as, for example, copper or other plateable metal. The locations of the conductive patterns can be made using a photo-patterning process such as, for example, a photolithography process and a photoresist material to form a photolithographic mask. The dielectric layers of the RDL substrate can be patterned with a photo-patterning process and can include a photolithographic mask through where light is exposed to photo-pattern desired features such as vias in the dielectric layers.

The dielectric layers can be made from photo-definable organic dielectric materials such as, for example, polyimide (PI), benzocyclobutene (BCB), or polybenzoxazole (PBO). Such dielectric materials can be spun-on or otherwise coated in liquid form, rather than attached as a pre-formed film. To permit proper formation of desired photo-defined features, such photo-definable dielectric materials can omit structural reinforcers or can be filler-free, without strands, weaves, or other particles, and could interfere with the light from the photo-patterning process. In some examples, such filler-free characteristics of filler-free dielectric materials can permit a reduction of the thickness of the resulting dielectric layer. Although the photo-definable dielectric materials described above can be organic materials, in some examples the dielectric materials of the RDL substrates can comprise one or more inorganic dielectric layers. Some examples of inorganic dielectric layer(s) can comprise silicon nitride ($Si_3N_4$), silicon oxide ($SiO_2$), or silicon oxynitride (SiON). The inorganic dielectric layer(s) can be formed by growing the inorganic dielectric layers using an oxidation or nitridization process rather than using photo-defined organic dielectric materials. Such inorganic dielectric layers can be filler-fee, without strands, weaves, or other dissimilar inorganic particles. In some examples, the RDL substrates can omit a permanent core structure or carrier such as, for example, a dielectric material comprising bismaleimide triazine (BT) or FR4 and these types of RDL substrates can comprise or be referred to as a coreless substrate. Substrates in this disclosure can comprise RDL substrates.

Figure 2D:
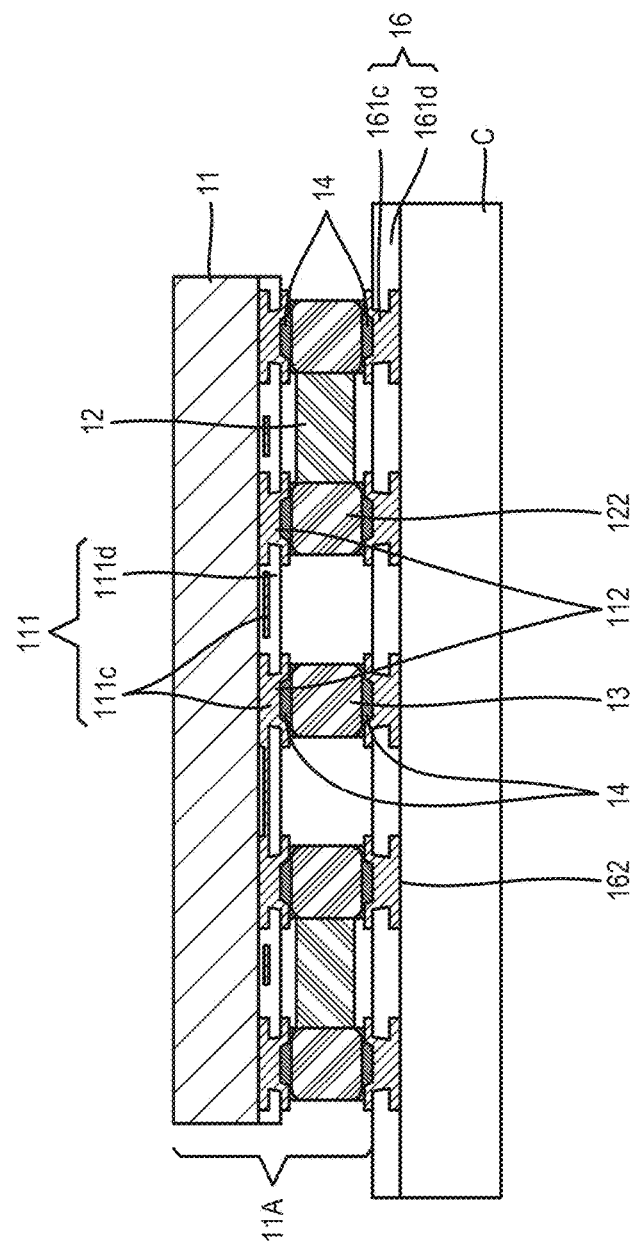

FIG. 2D shows a cross-sectional view of electronic device 10 at a later stage of manufacture. In the example shown in FIG. 2D, component device 11A, which includes electronic component 11 and one or more intermediate component(s) 12, is provided and coupled to conductive structure 161c of device interface structure 16.

FIGS. 3A and 3B show cross-sectional views of an example method for manufacturing an example component device 11A of electronic device 10.

In the example shown in FIG. 3A, component redistribution structure 111 can be provided on the upper (or active) side 113 of electronic component 11. In some examples, electronic component 11 can comprise or be referred to as a die, a chip, or a package. For example, electronic component 11 can comprise at least one of an application specific integrated circuit, a logic die, a micro controller unit, a memory, a digital signal processor, a network processor, a power management unit, an audio processor, an RF circuit, or a wireless-baseband-system-on-chip processor. In some examples, the thickness of electronic component 11, as measured between upper side 113 and a backside 114 of electronic component 11, can be in the range of approximately 50 μm to approximately 800 μm. Electronic component 11 comprises a component first side, a component second side opposite to the component first side, and a component lateral side connecting the component first side to the component second side. The component lateral sides defines a perimeter for electronic component 11. In some examples, the component first side can also be referred to as a component active side of electronic component 11.

Component redistribution structure 111 includes conductive structure 111c and dielectric structure 111d. Conductive structure 111c can also be referred to as a redistribution conductive structure and dielectric structure 111d can also be referred to as a redistribution dielectric structure. Conductive structure 111c and dielectric structure 111d comprise one or more conductive layers and one or more dielectric layers, respectively, and can be formed layer by layer over upper side 113 of electronic device 11. Component redistribution structure 111 can be provided on and can cover the upper side 113 of electronic component 11. In some examples, openings can be provided in the final dielectric layer to expose portions of the final conductive layer. Component terminals 112 can be provided within the openings in the final dielectric layer, such that component terminals 112 are coupled to the final conductive layer of conductive structure 111c. For example, component terminals 112 can be part of conductive structure 111c. In some examples, component terminals 112 may extend over the surface of the final dielectric layer of dielectric structure 111d. In some examples, the final dielectric layer of dielectric structure 111d may comprise a solder mask. Component redistribution structure 111 can comprise similar elements, features, or manufacturing methods to device interface structure 16 described above with reference to FIGS. 2A to 2C.

Electronic component 11 can be provided with component terminals 112 spaced apart from one another over upper side 113 of electronic component 11. In some examples, component terminals 112 can be provided in rows and columns over component redistribution structure 111. In some examples component terminals 112 can each comprise or be referred to as a conductor, a conductive material, a pad, a pillar, or an under-bump-metallurgy (UBM). Component terminals 112 can comprise a metallic material, aluminum, copper, an aluminum alloy, or an electrically conductive material such as a copper alloy. Component terminals 112 can be input/output terminals of the electronic component 11.

In the example shown in FIG. 3B, one or more intermediate component(s) 12 can be provided over electronic component 11. Intermediate terminals 122 of intermediate components 12 can be located over and coupled to component terminals 112 of electronic component 11. In some examples, pick-and-place equipment can pick up intermediate component 12 and place it on component terminals 112 of electronic component 11. Subsequently, intermediate component 12 can be coupled to component terminals 112 of electronic component 11 through a mass reflow, a thermocompression bonding, or a laser assisted bonding process. In some examples, intermediate component 12 can comprise or be referred to as a passive component. For example, intermediate component 12 can be a capacitor.

Intermediate component 12 can be provided with one or more intermediate terminal(s) 122. Each intermediate terminal 122 can extend from the upper side 123 of the intermediate component 12 to the lower side 124 of the intermediate component 12. Intermediate terminals 122 can be coupled to component terminals 112 of electronic component 11 by conductive interface 14. In some examples, intermediate terminals 122 can each comprise or be referred to as a pillar, a bump, or a post. Intermediate terminals 122 can comprise a metallic material, aluminum, copper, an aluminum alloy, or an electrically conductive material such as a copper alloy. Intermediate terminals 122 can be input/output terminals of intermediate component 12. Intermediate terminals 122 can couple component terminals 112 of electronic component 11 to conductive structure 161c of device interface structure 16, with momentary reference to FIG. 2D. Although component device 11A is shown including two intermediate components 12, it is contemplated and understood that component device 11A can include any number of intermediate components 12.

Conductive interface 14 can be provides as a portion of intermediate terminal 122 or as a portion component terminal 112 and can be made of a low melting point material. For example, conductive interface 14 can comprise a material selected from the group consisting of Sn, Ag, Pb, Cu, Sn—Pb, Sn37-Pb, Sn95-Pb, Sn—Pb—Ag, Sn—Cu, Sn—Ag, Sn—Au, Sn—Bi, Sn—Ag—Cu, and equivalents thereof. Intermediate terminals 122 of intermediate component 12 can be coupled to component terminal 112 of electronic component 11 by conductive interface 14. In some examples, the overall thickness of intermediate component 12, as measured between upper side 123 and lower side 124, can be in the range of approximately 100 μm to approximately 800 μm.

In some examples, one or more vertical interconnect(s) 13 can be provided on component terminal 112 of electronic component 11. Vertical interconnect(s) 13 can be provided by electrolytic plating, electroless plating, sputtering, PVD, CVD, MOCVD, ALD, LPCVD, or PECVD. In some examples, vertical interconnect 13 can be made of copper, gold, silver, palladium, or nickel. Vertical interconnect 13 can comprise a post, a pillar, a vertical wire, a bump, or a solder-coated-metallic-core-ball. Vertical interconnect 13 can be coupled to component terminal 112 of electronic component 11 by conductive interface 14. Conductive interface 14 can be provided as a portion of vertical interconnect 13 or as a portion of component terminal 112. In some examples, vertical interconnect 13 can couple component terminal 112 of electronic component 11 to conductive structure 161c of device interface structure 16, with momentary reference to FIG. 2D. The thickness of vertical interconnect 13 can be similar to the thickness of intermediate component 12 or the thickness of intermediate terminals 122. Although component device 11A is shown including one vertical interconnect 13, it is contemplated and understood that component device 11A may include any number of vertical interconnects 13. In some examples, component device 11A may be provided without any vertical interconnects 13.

After electronic component 11 and intermediate components 12 and vertical interconnects 13 are coupled together, a singulation process (e.g., a sawing operation) can be performed to separate/form individual component devices 11A. In the example shown in FIG. 2D, individual component devices 11A can be flipped and provided on conductive structure 161c of device interface structure 16. Component device 11A can be flipped to allow intermediate components 12 to be positioned under electronic component 11 (i.e., to position intermediate components 12 between electronic component 11 and device interface structure 16). In some examples, pick-and-place equipment can pick up individual component devices 11A and place the individual component devices 11A on conductive structure 161c of device interface structure 16.

Subsequently, intermediate terminals 122 of intermediate components 12 can be coupled to conductive structure 161c of device interface structure 16 through a mass reflow, a thermal compression, or a laser assisted bonding process. In some examples, the area (or footprint) of component device 11A can be in the range of approximately 0.5 mm×0.5 mm to approximately 30 mm×30 mm. In some examples, intermediate terminals 122 of intermediate components 12 can be coupled to conductive structure 161c of device interface structure 16 through conductive interface 14. In some examples, prior to bonding intermediate components 12 (i.e., prior to the mass reflow, the thermal compression, or the laser assisted bonding process), conductive interface 14 can be provided on intermediate terminals 122 or on conductive structure 161c.

In some examples, conductive interface 14 can couple vertical interconnect 13 to conductive structure 161c of device interface structure 16. In various examples, conductive interface 14 can be provided on vertical interconnect 13 or on conductive structure 161c.

Electronic component 11 can be coupled to device interface structure 16 through intermediate terminals 122 of intermediate components 12. In some examples, vertical interconnect 13 can also serve as a conductive interface that electrically connects electronic component 11 to device interface structure 16. In some examples, electrically connecting electronic component 11 and device interface structure 16 via intermediate terminals 122 can allow for a reduction in the number of vertical interconnects 13 included in package 11A. In some examples, electrically connecting electronic component 11 and device interface structure 16 via intermediate terminals 122 can allow vertical interconnects 13 to be eliminated from package 11A (e.g., electronic component 11 can be electrically coupled to device interface structure 16 solely through intermediate terminals 122). Positioning intermediate components 12 under electronic component 11 tends to decrease the overall area (e.g., footprint) of electronic device 10.

In some examples, intermediate components 12 and vertical interconnect 13 can be coupled to device interface structure 16 prior to electronic component 11. For example, electronic component 11 may be coupled to intermediate components 12 and vertical interconnect 13 after attaching intermediate components 12 and vertical interconnect 13 to device interface structure 16.

FIG. 2E shows a cross-sectional view of electronic device 10 at a later stage of manufacture. In the example shown in FIG. 2E, encapsulant 15 can be provided over and can cover device interface structure 16, electronic component 11, and intermediate components 12. In some examples, encapsulant 15 can also cover (e.g., surround) vertical interconnect 13. Encapsulant 15 can contact the upper side of device interface structure 16 and the lateral sides of electronic component 11 and intermediate component 12. Encapsulant 15 can also be located between component redistribution structure 111 and device interface structure 16. In some examples, encapsulant 15 can comprise or be referred to as a mold compound, an epoxy mold compound, a polymer, or a resin. In some examples, encapsulant 15 can comprise an organic resin, an inorganic filler, a curing agent, a catalyst, a coupling agent, a colorant, or a flame retardant, and can be formed by compression molding, transfer molding, liquid body molding, vacuum lamination, paste printing, or film assist molding method. In some examples, a portion of encapsulant 15 can be removed (e.g., by grinding) to expose the backside 114 of electronic component 11. In some examples, exposing backside 114 can improve heat dissipation of electronic component 11, while reducing the size of electronic device 10. In some examples, encapsulant 15 can be thinned by a grinding process or by a chemical etching process. In some examples, the thickness T3 of encapsulant 15 can be in the range of approximately 150 µm to approximately 1600 µm. Encapsulant 15 can protect device interface structure 16, electronic component 11, intermediate components 12, and vertical interconnects 13 from external elements, and enhance the structural integrity of electronic device 10. Encapsulant 15 is an example of an encapsulant structure.

FIG. 2F shows a cross-sectional view of electronic device 10 at a later stage of manufacture. In the example shown in FIG. 2F, carrier C can be separated from the lower side 164 of device interface structure 16. In some examples, carrier C can be separated from device interface structure 16 after the adhesive force of the temporary adhesive layer of carrier C is removed or reduced by applying heat, light, chemical solution, or external physical force. After removal of carrier C, device terminals 162 can be exposed from dielectric structure 161d at the lower side 164 of device interface structure 16.

Figure 2G:
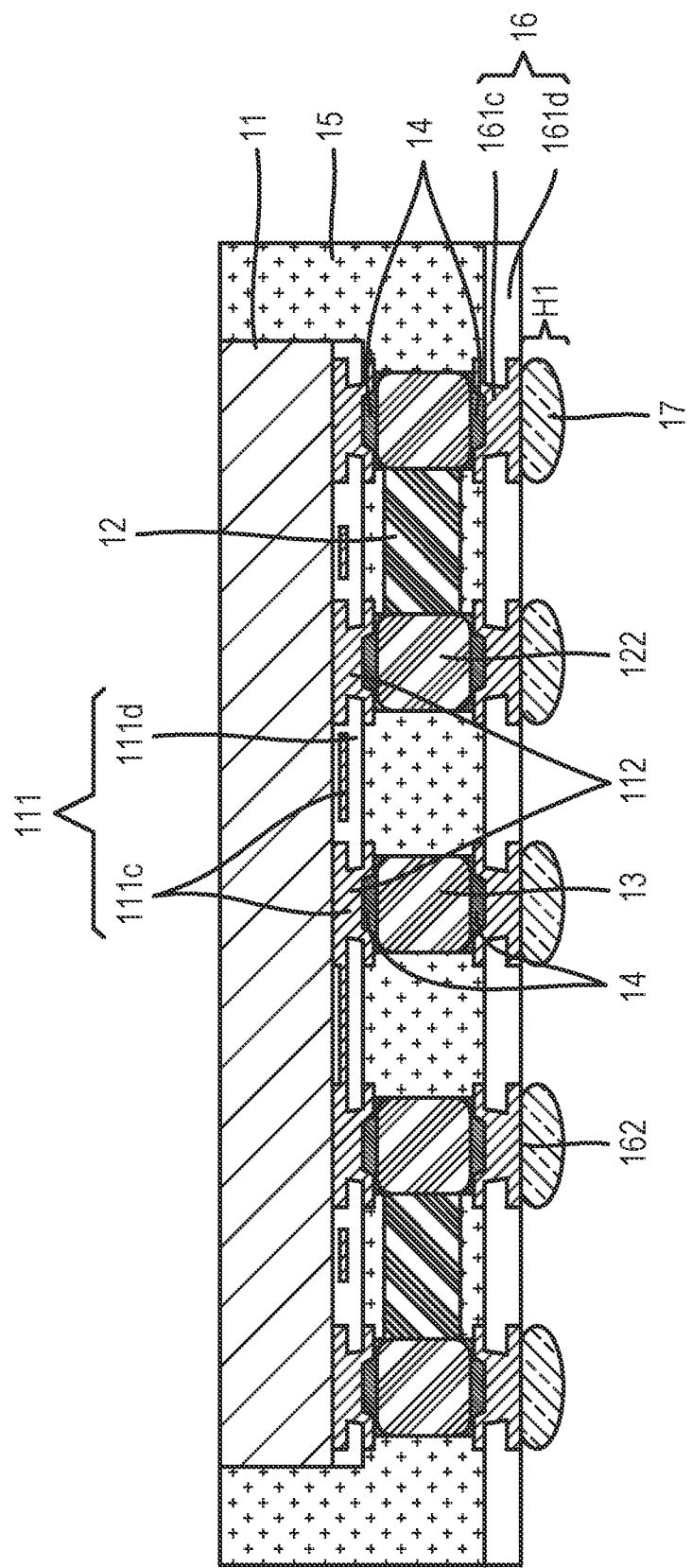

FIG. 2G shows a cross-sectional view of electronic device 10 at a later stage of manufacture. In the example shown in FIG. 2G, external terminals 17 can be provided over and coupled to the device terminals 162 of the device interface structure 16. External terminals 17 can be coupled to intermediate components 12 through conductive structure 161c of device interface structure 16. External terminals 17 can be electrically connected to electronic component 11 through conductive structure 161c of device interface structure 16 and intermediate components 12. In some examples, external terminals 17 can be electrically connected to electronic component 11 through conductive structure 161c of device interface structure 16 and vertical interconnect 13. In some examples, external terminals 17 can each comprise or be referred to as a pillar, a solder tip, a bump, or a ball. For example, external terminals 17 can comprise tin (Sn), silver (Ag), lead (Pb), copper (Cu), Sn—Pb, Sn37-Pb, Sn95-Pb, Sn—Pb—Ag, Sn—Cu, Sn—Ag, Sn—Au, Sn—Bi, or Sn—Ag—Cu. In some examples, the height H1 of each external terminal 17, as measured from its respective device terminal 162, can be in the range of approximately 25 µm to approximately 550 µm.

In some examples, a singulation process (e.g., sawing) can performed to separate encapsulant 15 and device interface structure 16 into individual electronic devices 10. Electronic device 10 can comprise electronic component 11, intermediate component(s) 12, conductive interface 14, encapsulant 15, device interface structure 16, and external terminals 17. In some examples, electronic device 10 can also comprise vertical interconnect(s) 13. External terminals 17 can be referred to as external input/output terminals of electronic device 10.

Figure 4:
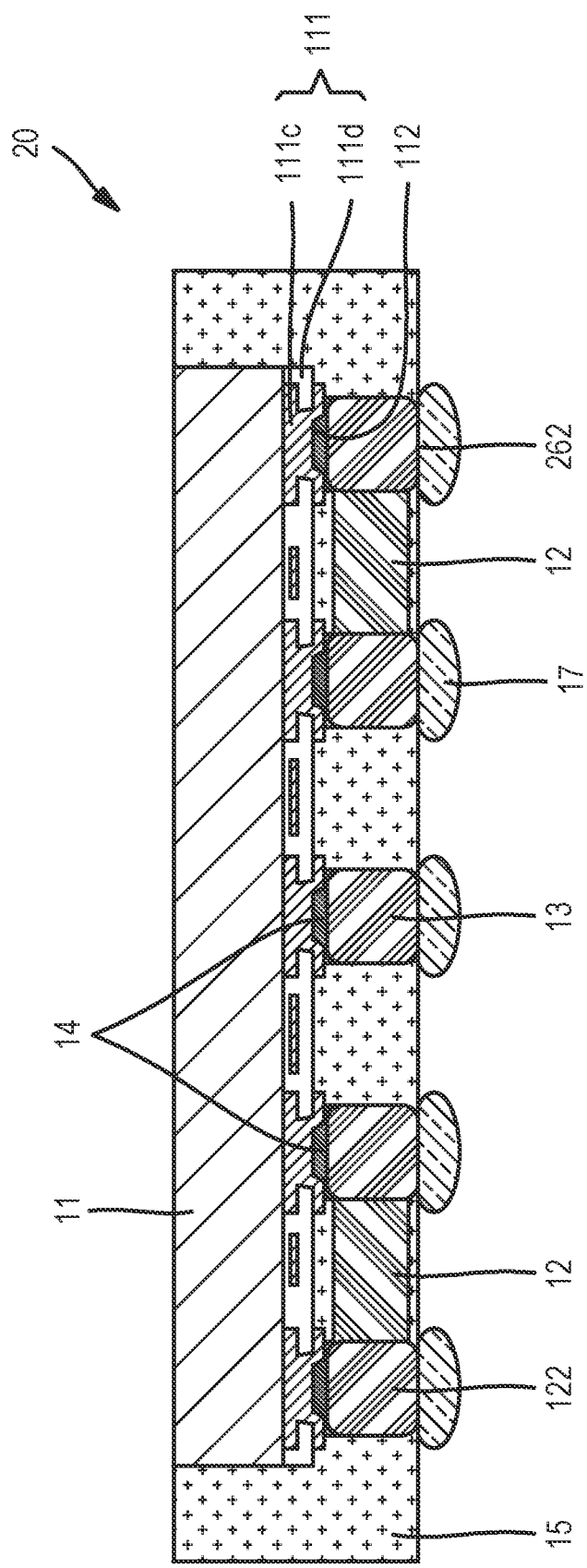
FIG. 4 shows a cross-sectional view of an example electronic device.

FIG. 4 shows a cross-sectional view of an example electronic device 20. In the example shown in FIG. 4, electronic device 20 can comprise electronic component 11, intermediate components 12, conductive interface 14, encapsulant 15, and external terminals 17. In some examples, electronic device 20 can also comprise vertical interconnect(s) 13.

In this example, electronic device 20 can be similar to electronic device 10 described above. For example, electronic component 11, intermediate components 12, vertical interconnect 13, conductive interface 14, encapsulant 15, and external terminals 17 of electronic device 20 can be similar to those same components in electronic device 10. In this example, electronic device 20 does not include device interface structure 16. In this example, intermediate terminals 122 of intermediate component 12 can provide device terminals 262 for connecting external terminals 17. For example, external terminals 17 may be formed on or in contact with intermediate terminals 122 of intermediate component 12.

FIGS. 5A to 5D show cross-sectional views of an example method for manufacturing an example electronic device 20.

Figure 5A:
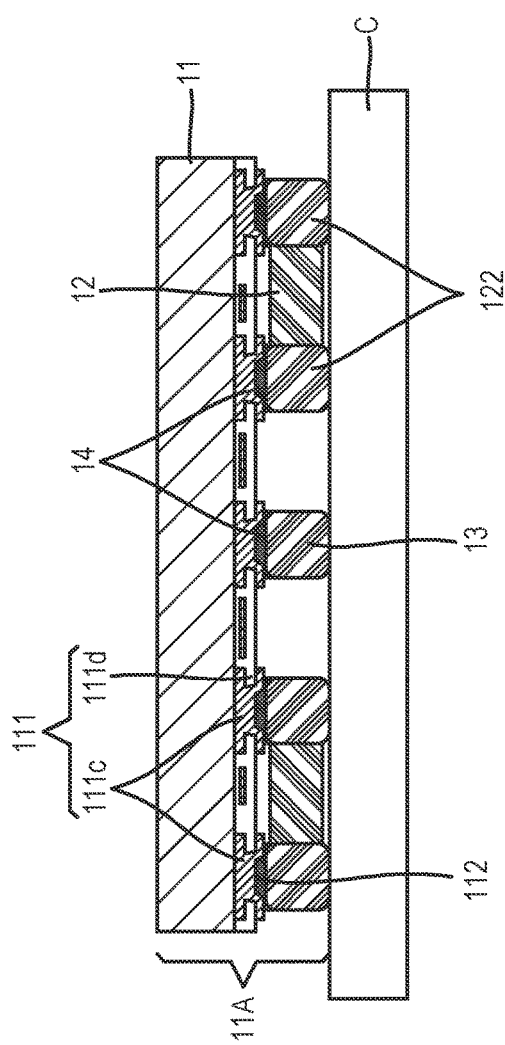
FIGS. 5A, 5B, 5C, and 5D show cross-sectional views of an example method for manufacturing an example electronic device.

FIG. 5A shows a cross-sectional view of electronic device 20 at an early stage of manufacture. In the example shown in FIG. 5A, component device 11A can be provided on the surface of carrier C. Component device 11A can be manufactured by the method for manufacturing the component device 11A shown in FIGS. 3A and 3B. Intermediate terminals 122 of intermediate components 12 can be located on or, in some examples, adhered to, the surface of a temporary adhesive layer of carrier C. In some examples, the lower side of vertical interconnect 13 (i.e., the side opposite electronic component 11) can be located on or, in some examples, adhered to, the surface of the temporary adhesive layer of carrier C.

Figure 5B:
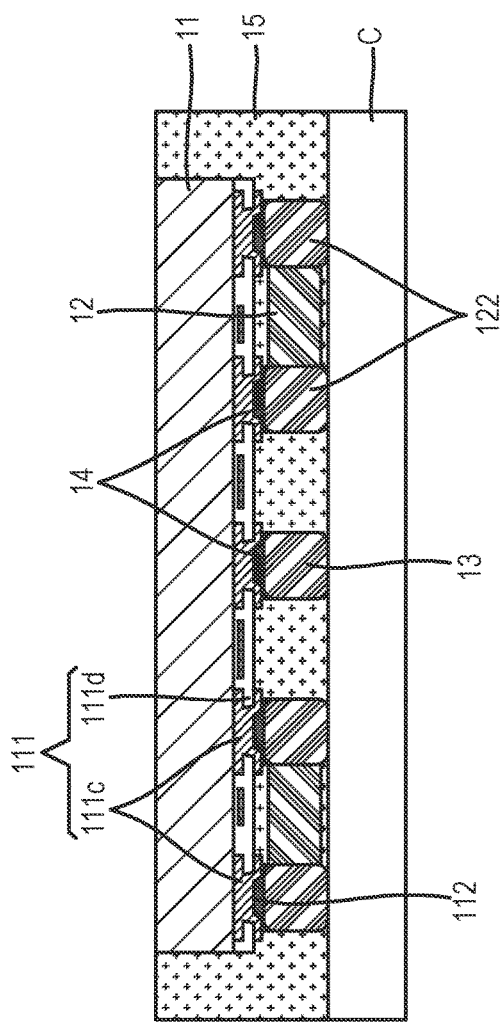

FIG. 5B shows a cross-sectional view of electronic device 20 at a later stage of manufacture. In the example shown in FIG. 5B, encapsulant 15 can be provided to cover carrier C, electronic component 11, and intermediate components 12. In some examples, encapsulant 15 can be provided to cover vertical interconnect 13. The encapsulant 15 can be in contact with the upper side of the carrier C and the lateral side walls of electronic component 11 and intermediate components 12. Encapsulant 15 can also be located between component redistribution structure 111 and carrier C. Encapsulant 15 can comprise similar elements, features, materials, or manufacturing methods to encapsulant 15 having been described above with reference to FIG. 2E. Encapsulant 15 is an example of an encapsulant structure.

Figure 5C:
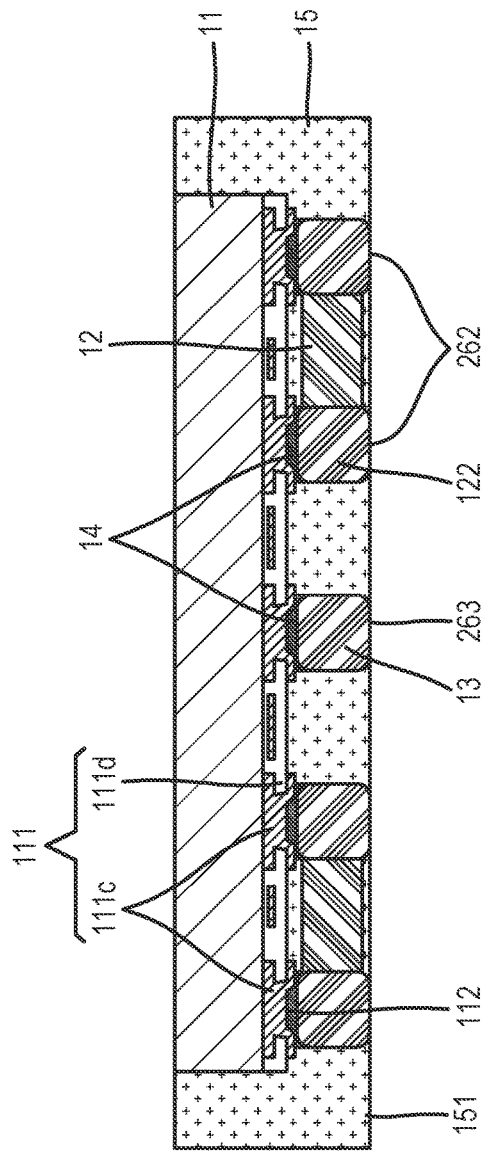

FIG. 5C shows a cross-sectional view of electronic device 20 at a later stage of manufacture. In the example shown in FIG. 5C, carrier C can be separated from the lower side of encapsulant 15. Removing carrier C can expose the lower side 151 of encapsulant 15 and the lower side of intermediate terminals 122 of intermediate component 12. In some examples, the exposed portion of intermediate terminals 122 can provide device terminals 262. For example, device terminal 262 can be a portion of intermediate terminal 122. In some examples, removal of carrier C can also expose the lower side of vertical interconnect 13 at the lower side 151 of encapsulant 15. The exposed portion of vertical interconnect 13 can provide device terminal 263. For example, device terminal 263 can be a portion of vertical interconnect 13. The method of removing carrier C can be similar to the method of removing carrier C, as described above with reference to FIG. 2F.

Figure 5D:
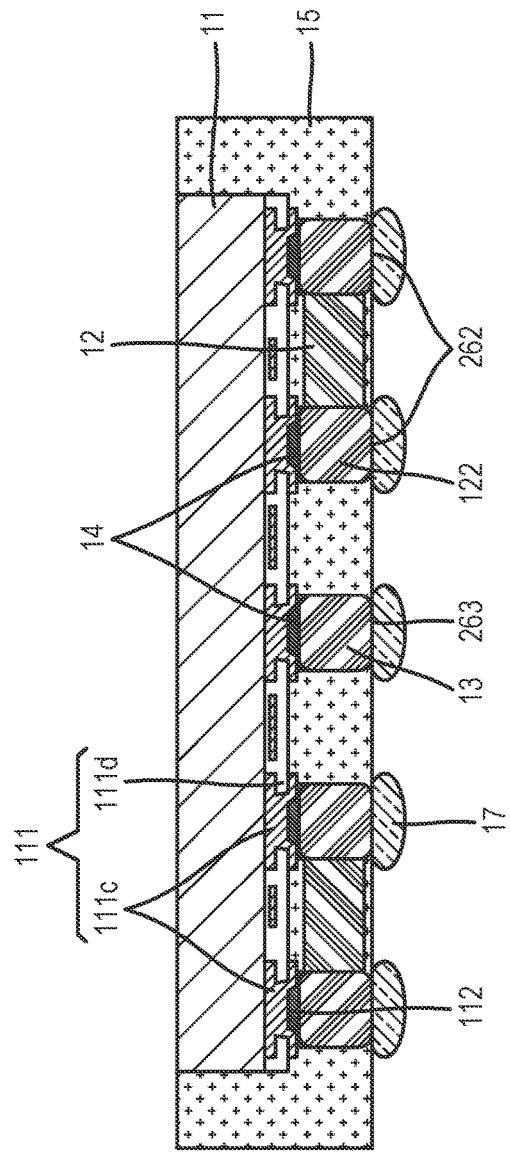

FIG. 5D shows a cross-sectional view of electronic device 20 at a later stage of manufacture. In the example shown in FIG. 5D, external terminals 17 can be provided on and coupled to device terminals 262 of intermediate terminals 122. External terminals 17 can be electrically connected to electronic component 11 through intermediate terminals 122 of intermediate components 12. In some examples, external terminals 17 can be provided on and coupled to device terminal 263 of vertical interconnect 13. For example, external terminal 17 can be electrically connected to electronic component 11 through vertical interconnect 13. External terminals 17 can comprise similar elements, features, materials, or manufacturing methods to those of external terminals 17, as described above with reference to FIG. 2G.

Figure 6:
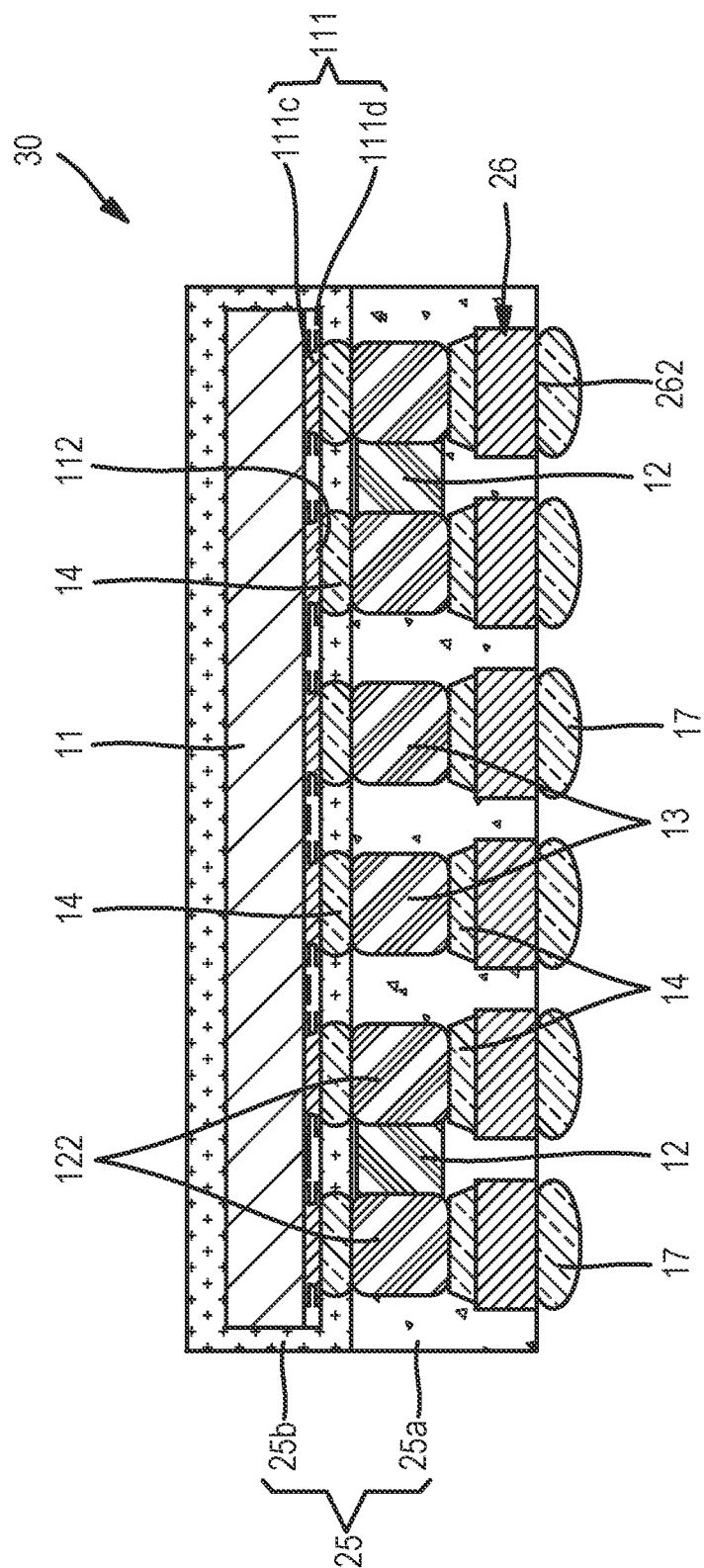
FIG. 6 shows a cross-sectional view of an example electronic device.

FIG. 6 shows a cross-sectional view of an example electronic device 30. In the example shown in FIG. 6, electronic device 30 can comprise electronic component 11, intermediate components 12, conductive interface 14, intermediate encapsulant 25a, component encapsulant 25b, device interface structure 26, and external terminals 17. In some examples, electronic device 30 can also comprise vertical interconnect 13. In some examples, intermediate encapsulant 25a and component encapsulant 25b are portions or parts of an encapsulant structure 25.

In this example, electronic device 30 can be similar to electronic device 10 described above. For example, electronic component 11, intermediate components 12, conductive interface 14, vertical interconnect 13, and external terminals 17 of electronic device 30 can be similar to corresponding elements of electronic device 10. In this example, electronic device 30 can comprise intermediate encapsulant 25a, component encapsulant 25b, and device interface structure 26. Device interface structure 26 can provide device terminals 262.

FIGS. 7A to 7G show cross-sectional views of an example method for manufacturing an example electronic device 30.

FIG. 7A shows a cross-sectional view of electronic device 30 at an early stage of manufacture. In the example shown in FIG. 7A, cavities 264 can be provided in upper side 261 of interface structure 26. In some examples, cavities 264 can be formed by removing a portion of device interface structure 26 from upper side 261 of interface structure 26. Cavities can extend partially through interface structure 26 such that a portion of interface structure 26 remains between the floor 265 of each cavity 264 and lower side 266 of interface structure 26. In some examples, device interface structure 26 can comprise or be referred to as a conductor, a conductive material, a conductive workpiece, a conductive layer, or a lead frame. For example, device interface structure 26 can comprise a copper alloy (e.g., at least one of Ni, Si, P, and Ti being included in Cu), an iron-nickel alloy, or a Cu/stainless steel (SUS)/Cu clad metal. In some examples, device interface structure 26 can comprise a plating layer made of, for example, tin, nickel, palladium, gold, or silver, plated on the surfaces of device interface structure 26 to prevent oxidation. In some examples, the thickness of device interface structure 26, as measured between upper side 261 and lower side 266, can be in the range of approximately 80 μm to approximately 800 μm. Upper side 261 is an example of a first side of a workpiece and lower side 266 is an example of a second side of a workpiece.

Device interface structure 26 can include device terminals 262. Cavities 264 may be located between and/or form adjacent device terminals 262. In some examples, cavities 264 and device terminals 262 can be provided by providing a patterned mask layer (e.g., photoresist) on the upper side 261 of device interface structure 26 and removing portions of device interface structure 26 exposed from the patterned mask layer by, for example, etching to form cavities 264 and devices terminals 262. Device terminals 262 can be spaced apart from one another. For example, device terminals 262 can be arranged in one or more columns and/or rows. In some examples, device terminals 262 can comprise or be referred to as leads, lands, pads, or posts. In some examples, the height of each of device terminals 262, as measured between cavity floor 265 and upper side 261 of device interface structure, can be in the range of approximately 20 μm to approximately 200 μm.

FIG. 7B shows a cross-sectional view of electronic device 30 at a later stage of manufacture. In the example shown in FIG. 7B, intermediate components 12 can be provided on the upper side 261 of device terminals 262 of device interface structure 26. Intermediate terminals 122 of intermediate components 12 can be coupled to device terminals 262 through conductive interface 14. In some examples, conductive interface 14 can be provided on intermediate terminals 122 or on device terminals 262. Intermediate components 12 and conductive interface 14 can comprise similar elements, features, materials, or manufacturing methods to those of intermediate component 12 and conductive interface 14, as described above with reference to FIGS. 2D and 3B.

In some examples, vertical interconnect 13 can be provided on the upper side 261 of a device terminal 262 of device interface structure 26. Vertical interconnect 13 can be coupled to device terminal 262 of device interface structure 26 through conductive interface 14. In some examples, conductive interface 14 can be provided on device terminal 262 or on vertical interconnect 13. Vertical interconnect 13 can comprise similar elements, features, materials, or manufacturing methods to those of vertical interconnect 13, as described above with reference to FIGS. 2D and 3B.

Figure 7C:
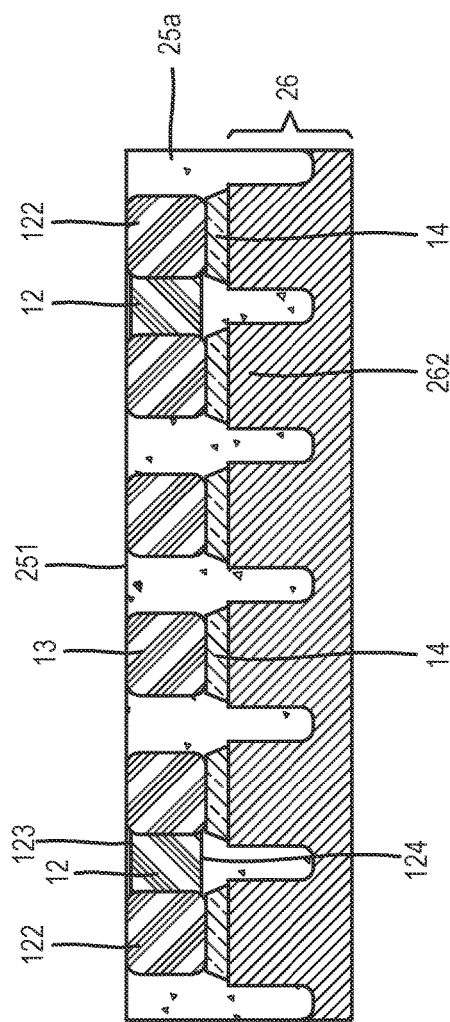

FIG. 7C shows a cross-sectional view of electronic device 30 at a later stage of manufacture. In the example shown in FIG. 7C, intermediate encapsulant 25a can be provided over and can cover device interface structure 26 and intermediate components 12. Intermediate encapsulant 25a can fill cavities 264 of device interface structure 26, and can contact the upper side 123, the lateral sides, and the lower side 124 of intermediate component 12. The upper side of intermediate terminals 122 of intermediate component 12 can be exposed from the upper side 251 of intermediate encapsulant 25a. In some examples, intermediate encapsulant 25a can be provided to cover or surround vertical interconnect 13. The upper side of vertical interconnect 13 can be exposed from the upper side 251 of intermediate encapsulant 25a. Intermediate encapsulant 25a can comprise similar elements, features, materials, or manufacturing methods to those of encapsulant 15, as described above with reference to FIG. 2E. Intermediate encapsulant 25a is an example of an interface dielectric structure. That is, the interface dielectric structure of device interface structure 26 comprises intermediate encapsulant 25a.

Figure 7D:
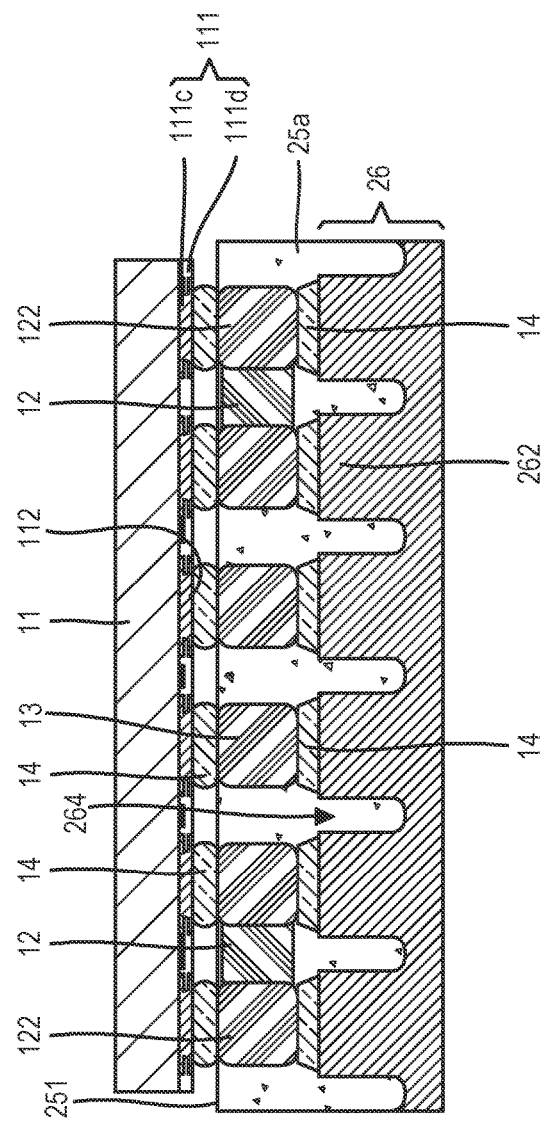

FIG. 7D shows a cross-sectional view of electronic device 30 at a later stage of manufacture. In the example shown in FIG. 7D, electronic component 11 can be provided on intermediate terminals 122 of intermediate components 12. Electronic component 11 can comprise component redistribution structure 111, including conductive structure 111c and a dielectric structure 111d. Electronic component 11 can be located over upper side 251 of intermediate encapsulant 25a with component redistribution structure 111 oriented toward intermediate terminals 122. Conductive structure 111c of component redistribution structure 111 can comprise component terminals 112. Component terminals 112 can be coupled to intermediate terminals 122. For example, component terminals 112 of electronic component 11 can be coupled to intermediate terminals 122 by conductive interface 14. Electronic component 11 can be electrically connected to device interface structure 26 through intermediate terminals 122 of intermediate components 12.

In some examples, component terminals 112 of electronic component 11 can be coupled to vertical interconnect 13 by conductive interface 14. Electronic component 11 can be electrically connected to device interface structure 26 through vertical interconnect 13. Electronic component 11 can comprise similar elements, features, materials, or manufacturing methods to those of electronic component 11, as described above with reference to FIGS. 2D and 3B.

FIG. 7E shows a cross-sectional view of electronic device 30 at a later stage of manufacture. In the example shown in FIG. 7E, component encapsulant 25b can be provided over and can cover intermediate encapsulant 25a and electronic component 11. Component encapsulant 25b can contact the upper side 251 of intermediate encapsulant 25a. Component encapsulant 25b can be located between and can contact component redistribution structure 111 and intermediate encapsulant 25a. Component encapsulant 25b can contact backside 114 and the lateral sides of electronic component 11. In some examples, backside 114 of electronic component 11 can be exposed from the upper side of component encapsulant 25b (i.e., at the side opposite device interface structure 26). In some examples, the thickness of component encapsulant 25b, as measured from upper side 251 of intermediate encapsulant 25a, can be in the range of approximately 50 μm to approximately 800 μm. Component encapsulant 25b can comprise similar elements, features, materials, or manufacturing methods to those of encapsulant 15, as described above with reference to FIG. 2E.

FIG. 7F shows a cross-sectional view of electronic device 30 at a later stage of manufacture. In the example shown in FIG. 7F, the lower sides 267 of device terminals 262 are exposed by removing a lower portion of device interface structure 26. In response to removal of the lower portion of device interface structure 26, device terminals 262 are electrically isolated from one another by the intermediate encapsulant 25a located within cavities 264 (FIG. 7B) and surrounds device terminals 262. In various examples, the lower side 253 of intermediate encapsulant 25a and the lower sides 267 of device terminals 262 can be coplanar. Lower side 253 can also be referred to an outer side of intermediate encapsulant 25a. Device terminals 262 can also be referred to as an interface conductive structure. In some examples, the lower portion of device interface structure 26 can be removed by etching. In response to removal of the lower portion of device interface structure 26, device interface structure 26 can comprise electrically isolated device terminals 262. Intermediate encapsulant 25a can be interposed between and can electrically isolate adjacent device terminals 262 from one other. In some examples, the thickness of device interface structure 26, as measured between the upper side 261 and the lower side 267 of device terminals 262, can be in the range of approximately 10 μm to approximately 100 μm. In some examples, the thickness of intermediate encapsulant 25a, as measured between upper side 251 and lower side 253 of intermediate encapsulant, can be in the range of approximately 110 μm to approximately 900 μm.

Figure 7G:
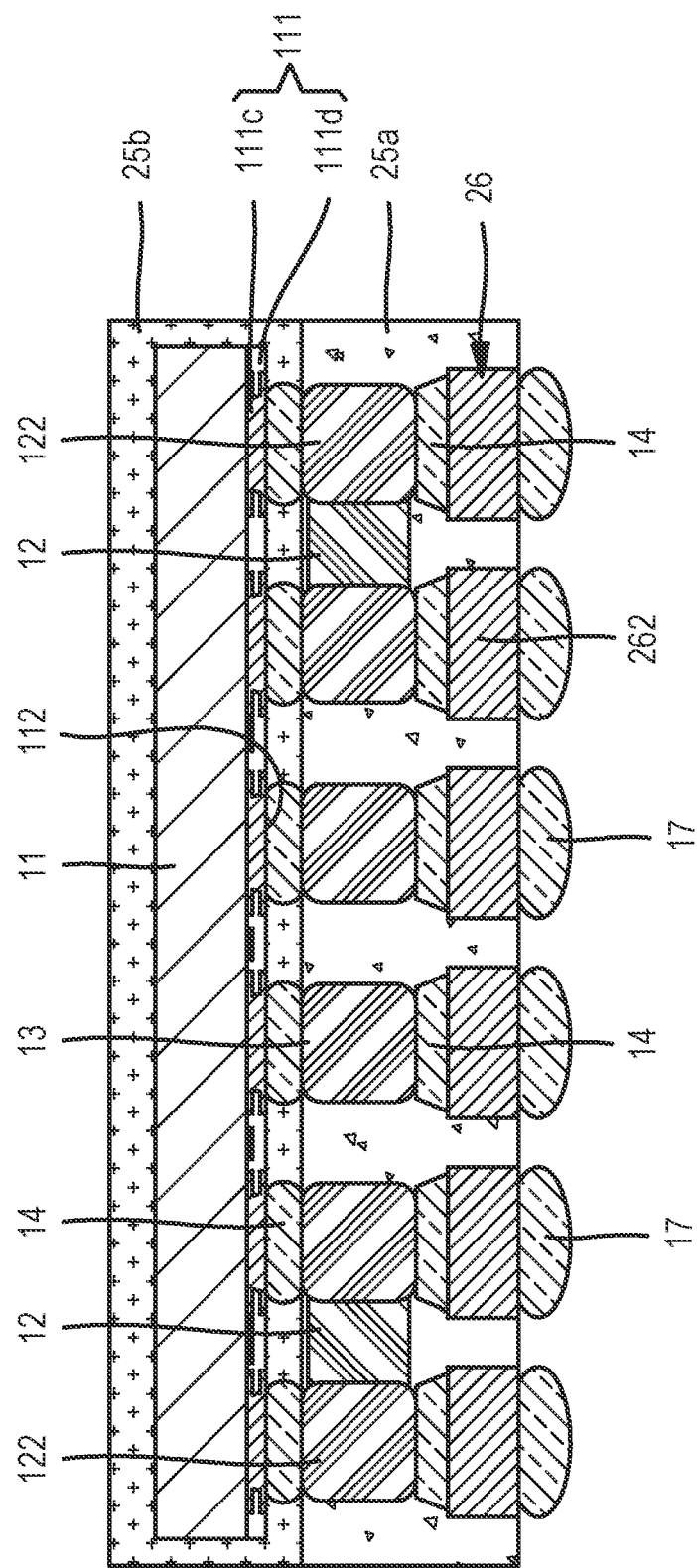

FIG. 7G shows a cross-sectional view of electronic device 30 at a later stage of manufacture. In the example shown in FIG. 7G, external terminals 17 can be provided on and coupled to device terminals 262 of device interface structure 26. External terminals 17 can be electrically connected to intermediate components 12 through device terminals 262 of device interface structure 26. External terminals 17 can be electrically connected to electronic component 11 through device terminals 262 of device interface structure 26 and intermediate terminals 122 of intermediate components 12. In some examples, external terminals 17 can be electrically connected to electronic component 11 through device terminal 262 of device interface structure 26 and vertical interconnect 13. External terminals 17 can comprise similar elements, features, materials, or manufacturing methods to those of external terminals 17, as described above with reference to FIG. 2G. External terminals 17 can be referred to as external input/output terminals of electronic device 30. In some examples, a singulation process (e.g., sawing) can performed to separate intermediate encapsulant 25a and component encapsulant 25b into individual electronic devices 30.

In summary structures and methods have been described for an electronic device. In some examples, the electronic device includes an electronic component, an intermediate component, and an intermediate terminal. The intermediate terminal is coupled to both the electronic component and the intermediate component within a perimeter of the electronic device. In some examples, the electronic device includes a redistribution structure coupled between the electronic component and the intermediate terminal, or a device interface structure coupled between the intermediate terminal and an outer side of the electronic device. In some examples, the electronic further includes a vertical interconnect coupled to the electronic component within the perimeter.

The present disclosure includes reference to certain examples; however, it will be understood by those skilled in the art that various changes may be made and equivalents may be substituted without departing from the scope of the disclosure. In addition, modifications may be made to the disclosed examples without departing from the scope of the present disclosure. Therefore, it is intended that the present disclosure not be limited to the examples disclosed, but that the disclosure will include all examples falling within the scope of the appended claims.

What is claimed is:

1. An electronic device, comprising:
an electronic component including a component first side, a component second side opposite to the component first side, and a component lateral side connecting the component first side to the component second side, wherein the component lateral side defines a perimeter of the electronic component;
a component redistribution structure coupled to the component first side, the component redistribution structure comprising a redistribution conductive structure and a redistribution dielectric structure;
a first intermediate terminal coupled to the electronic component within the perimeter;
an intermediate component coupled to the first intermediate terminal within the perimeter;
a device interface structure comprising an interface conductive structure and an interface dielectric structure; and
an encapsulant structure over the intermediate component, at least a portion of the first intermediate terminal, and at least a portion of the electronic component, wherein:
the first intermediate terminal is coupled to the interface conductive structure; and
the first intermediate terminal is coupled to the redistribution conductive structure.

2. The electronic device of claim 1, wherein:
the encapsulant structure is over the component redistribution structure and is over at least a portion of the device interface structure.

3. The electronic device of claim 1, wherein:
the encapsulant structure comprises an intermediate encapsulant and a component encapsulant;
the interface conductive structure comprises device terminals;
the interface dielectric structure comprises the intermediate encapsulant;
the intermediate encapsulant is disposed between the device terminals;
the intermediate encapsulant has an outer side; and
the device terminals are exposed from the outer side.

4. The electronic device of claim 1, further comprising:
a vertical interconnect coupled to the electronic component within the perimeter.

5. The electronic device of claim 1, further comprising:
a second intermediate terminal coupled to the electronic component and the intermediate component within the perimeter.

6. The electronic device of claim 1, further comprising:
an external terminal coupled to the first intermediate terminal.

7. An electronic device, comprising:
an electronic component;
a component redistribution structure coupled to the electronic component, the component redistribution structure comprising a redistribution conductive structure and a redistribution dielectric structure;
a first intermediate terminal coupled to the redistribution conductive structure;
an intermediate component coupled to the first intermediate terminal; and
an encapsulant structure located over the component redistribution structure, the intermediate component, at least a portion of the first intermediate terminal, and at least a portion of the electronic component.

8. The electronic device of claim 7, further comprising:
a second intermediate terminal coupled to the redistribution conductive structure and coupled to the intermediate component.

9. The electronic device of claim 7, further comprising:
an external terminal coupled to the first intermediate terminal.

10. The electronic device of claim 7, further comprising:
a device interface structure comprising an interface conductive structure and an interface dielectric structure;
wherein:
the intermediate component is between the component redistribution structure and the device interface structure;
the first intermediate terminal is coupled to the interface conductive structure; and
the encapsulant structure is located over at least a portion of the device interface structure.

11. The electronic device of claim 10, wherein:
the device interface structure comprises a first side and a second side opposite to the first side; and
the encapsulant structure is located over the first side of the device interface structure.

12. The electronic device of claim 11, wherein:
the second side of the device interface structure is devoid of the encapsulant structure.

13. The electronic device of claim 10, wherein:
the encapsulant structure comprises an intermediate encapsulant and a component encapsulant;
the interface conductive structure comprises a device terminal;
the interface dielectric structure comprises the intermediate encapsulant; and
the device terminal is exposed from the intermediate encapsulant.

14. The electronic device of claim 13, wherein:
the electronic component is within the component encapsulant; and
the intermediate component is within the intermediate encapsulant.

15. The electronic device of claim 7, wherein:
the electronic component includes a component first side, a component second side opposite to the component first side, and a component lateral side connecting the component first side to the component second side;

the component redistribution structure is coupled to the component first side;
the component lateral side defines a perimeter of the electronic component; and
the first intermediate terminal and the intermediate component are inside the perimeter.

16. The electronic device of claim 7, wherein:
the first intermediate terminal is exposed from the encapsulant structure.

17. A method of manufacturing an electronic device, comprising:
providing an electronic component including a component redistribution structure coupled to the electronic component, the component redistribution structure comprising a redistribution conductive structure and a redistribution dielectric structure;
providing an intermediate component comprising a first intermediate terminal;
coupling the first intermediate terminal to the redistribution conductive structure; and
providing an encapsulant structure over the component redistribution structure, the intermediate component, at least a portion of the first intermediate terminal, and at least a portion of the electronic component.

18. The method of claim 17, further comprising:
providing a device interface structure comprising an interface conductive structure and an interface dielectric structure;
coupling the first intermediate terminal to the interface conductive structure; and
coupling a vertical interconnect to the redistribution conductive structure and to the interface conductive structure;
wherein:
providing the electronic component comprises providing the electronic component with a lateral side defining a perimeter;
coupling the first intermediate terminal comprises coupling so that the first intermediate terminal and intermediate component are within the perimeter;
coupling the vertical interconnect comprises coupling the vertical interconnect so that the vertical interconnect is within the perimeter; and
providing the encapsulant structure comprises providing the encapsulant structure located over at least a portion of the device interface structure.

19. The method of claim 18, wherein:
providing the device interface structure comprises:
providing a conductive workpiece comprising a first side and a second side opposite to the first side; and
providing cavities extending partially inward into the conductive workpiece from the first side, the cavities laterally spaced apart to define the interface conductive structure comprising device terminals between the cavities;
coupling the first intermediate terminal comprises coupling the first intermediate terminal to first device terminal of the device terminals;
the method further comprises coupling a vertical interconnect to a second device terminal of the device terminals and to the redistribution conductive structure;
providing the encapsulant structure comprises:
providing an intermediate encapsulant within the cavities and surrounding the intermediate component, the first intermediate terminal, and the vertical interconnect, the interface dielectric structure comprising the intermediate encapsulant; and
providing a component encapsulant over the electronic component; and
the method further comprises removing a portion of the conductive workpiece from the second side to expose the intermediate encapsulant and to separate the device terminals.

20. The method of claim 18, wherein:
providing the device interface structure comprises providing the device interface structure coupled to a carrier;
coupling the first intermediate terminal comprises coupling the first intermediate terminal to the interface conductive structure while the device interface structure is coupled to the carrier; and
the method further comprises removing the carrier after providing the encapsulant structure.

* * * * *